US008929167B2

(12) United States Patent
Kim et al.

(10) Patent No.: US 8,929,167 B2
(45) Date of Patent: Jan. 6, 2015

(54) MRAM SELF-REPAIR WITH BIST LOGIC

(71) Applicant: QUALCOMM Incorporated, San Diego, CA (US)

(72) Inventors: Jung Pill Kim, San Diego, CA (US); Taehyun Kim, San Diego, CA (US); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/756,136

(22) Filed: Jan. 31, 2013

(65) Prior Publication Data
US 2014/0211551 A1 Jul. 31, 2014

(51) Int. Cl.
G11C 29/00 (2006.01)
G11C 11/00 (2006.01)
G11C 7/10 (2006.01)
G11C 29/44 (2006.01)
G11C 11/16 (2006.01)
G11C 11/15 (2006.01)
G11C 11/155 (2006.01)
G11C 29/12 (2006.01)

(52) U.S. Cl.
CPC ............ G11C 29/4401 (2013.01); G11C 11/16 (2013.01); G11C 11/15 (2013.01); G11C 11/155 (2013.01); G11C 11/165 (2013.01); G11C 29/12 (2013.01); G11C 2029/1208 (2013.01); G11C 2029/4402 (2013.01)
USPC ........................ 365/201; 365/158; 365/189.07

(58) Field of Classification Search
CPC ...................................................... G11C 29/12

USPC .......................................................... 365/201
See application file for complete search history.

(56) References Cited

U.S. PATENT DOCUMENTS

| 6,297,997 | B1 | 10/2001 | Ohtani et al. | |
|---|---|---|---|---|
| 6,895,537 | B2 * | 5/2005 | Kawagoe et al. | 714/710 |
| 7,313,733 | B2 | 12/2007 | Tzeng | |
| 7,352,639 | B2 * | 4/2008 | Lamorey et al. | 365/201 |
| 7,646,655 | B2 | 1/2010 | Mondello et al. | |
| 7,895,482 | B2 | 2/2011 | Fischer et al. | |
| 8,127,184 | B2 | 2/2012 | Mohammad | |
| 2002/0039311 | A1 | 4/2002 | Takeuchi et al. | |
| 2008/0298126 | A1 | 12/2008 | Ohta et al. | |
| 2008/0313510 | A1 | 12/2008 | Baker | |
| 2013/0227344 | A1 * | 8/2013 | Sohn et al. | 714/6.21 |

FOREIGN PATENT DOCUMENTS

EP       1132924 A2   9/2001

OTHER PUBLICATIONS

International Search Report and Written Opinion—PCT/US2014/013183—ISA/EPO—Jul. 9, 2014.

* cited by examiner

Primary Examiner — Son Mai
(74) Attorney, Agent, or Firm — Seyfarth Shaw LLP

(57) ABSTRACT

Memory self-repair circuitry includes a memory cell array on a chip, and built-in self test (BIST) circuitry on the chip coupled to the memory cell array. The BIST circuitry is configured to perform a magnetic random access memory (MRAM) write operation to write addresses of failed memory cells in the memory cell array to a failed address sector also in the memory cell array. The memory self-repair circuitry also includes first select circuitry coupled between the BIST circuitry and the memory cell array. The first select circuitry is configured to selectively couple an output of the BIST circuitry and an input to the memory cell array.

27 Claims, 12 Drawing Sheets

MRAM SELF-REPAIR WITH BIST LOGIC

TECHNICAL FIELD

The present disclosure generally relates to magnetic random access memory (MRAM) devices. More specifically, the present disclosure relates to an architecture to perform MRAM self-repair using built-in self test (BIST) logic circuitry.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization, or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic 0 and a logic 1 value stored by the MTJ.

To determine whether data in a conventional MRAM represents a logic 1 or a logic 0, the resistance of the MTJ in the bitcell is compared with a reference resistance. The reference resistance in conventional MRAM circuitry is a midpoint resistance between the resistance of an MTJ having a parallel magnetic orientation and an MTJ having an anti-parallel magnetic orientation. One way of generating a midpoint reference resistance is coupling in parallel an MTJ known to have a parallel magnetic orientation and an MTJ known to have an anti-parallel magnetic orientation.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

SUMMARY

According to an aspect of the present disclosure, a memory includes a memory cell array on a chip, a built-in self test (BIST) circuit on the chip and coupled to the memory cell array, and a first select circuit. The BIST circuit is configured to perform a write operation to write addresses of failed memory cells in the memory cell array to a failed address sector in the memory cell array. The first select circuit is coupled between the BIST circuit and the memory cell array. The first select circuit is also configured to selectively couple an output of the BIST circuit and an input to the memory cell array.

According to another aspect of the present disclosure, a memory includes a memory cell array on a chip, global control logic that is coupled to the memory cell array, a built-in self test (BIST) circuit on the chip coupled to the memory cell array, and a first select circuit. The global control logic includes an address matching circuit. The BIST circuit is configured to perform a write operation to write addresses of failed memory cells in the memory cell array to a failed address sector in the memory cell array. The address matching circuit is also configured to receive the addresses of the failed memory cells directly from the failed address sector. The first select circuit is coupled between the BIST circuit and the memory cell array. The first select circuit is also configured to selectively couple an output of the BIST circuit and an input to the memory cell array.

According to another aspect of the present disclosure, a method for memory self repair includes performing a built-in self test (BIST) process by BIST circuitry on a chip to identify addresses of failed memory cells in a memory cell array on the chip. The method also includes transferring the addresses of the failed memory cells directly from the BIST circuitry to a portion of the memory cell array.

Another aspect of the present disclosure includes an apparatus for memory self repair. According to this aspect, the apparatus includes means for performing a built-in self test (BIST) process by BIST circuitry on a chip to identify addresses of failed memory cells in a memory cell array on the chip. The apparatus also includes means for transferring the addresses of the failed memory cells directly from the BIST circuitry to a portion of the memory cell array.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
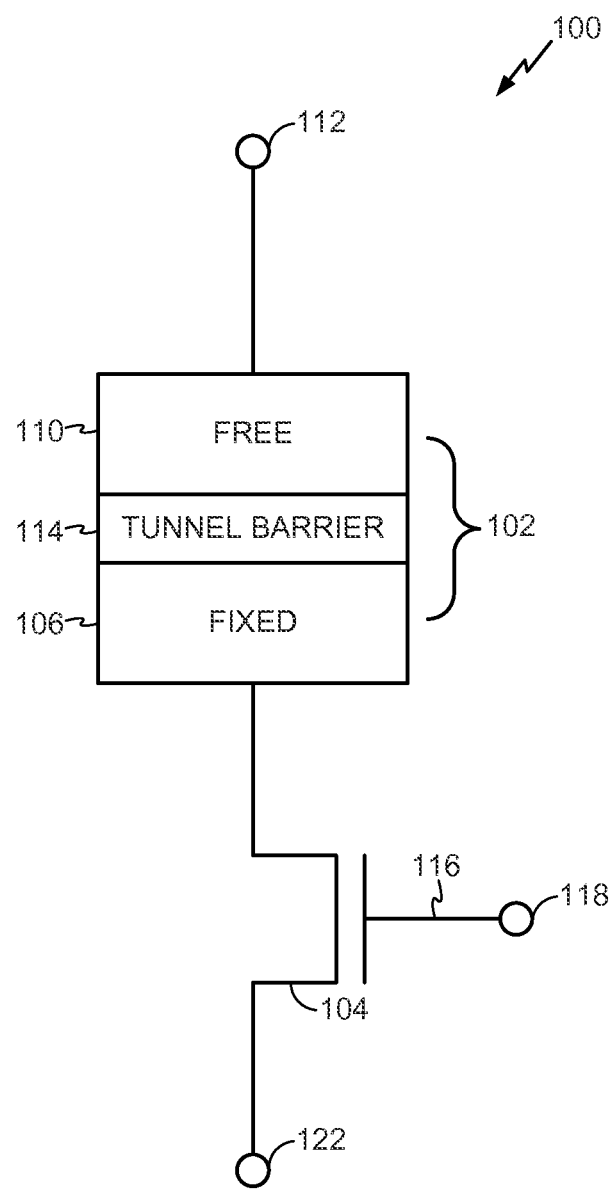
FIG. 1 is a diagram of a magnetic tunnel junction (MTJ) device connected to an access transistor.

FIG. 1 illustrates a memory cell 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be an anti-ferromagnetic material, such as CoFeB, and the tunnel barrier layer 114 may be MgO, for example.

Figure 2:
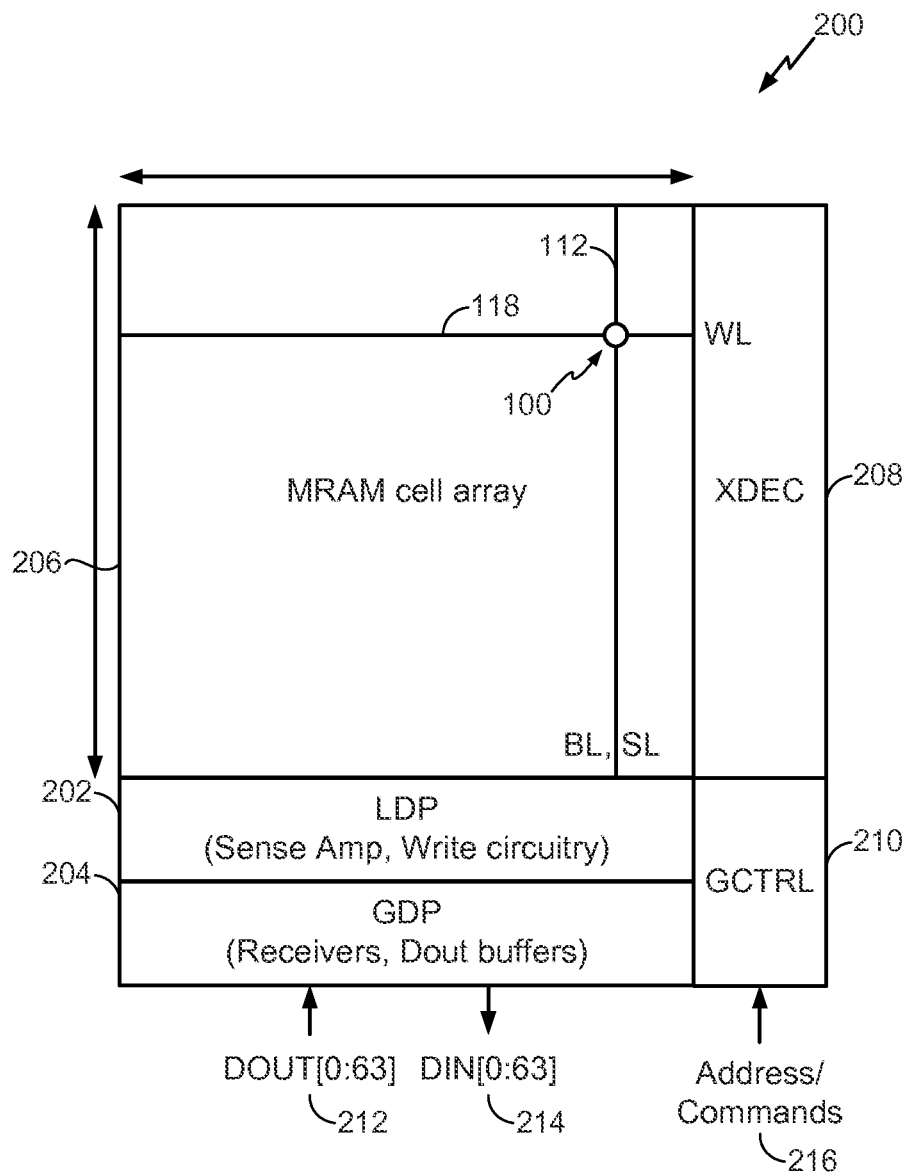
FIG. 2 is a diagram of a conventional MRAM cell array.

FIG. 2 illustrates an MRAM architecture 200. The MRAM architecture 200 may include a local data path (LDP) 202, a global data path (GDP) 204, an MRAM cell array 206, a decoder 208, and a global control unit 210. The LDP 202 includes one or more sense amplifiers and a programming write driver (not shown). The GDP 204 includes circuitry for input and output signal lines or pins, such as a data in (DIN) 212 and a data out (DOUT) 214. The global data path 204 may also include error correcting code (ECC) circuitry (not shown). Addresses or commands 216 may also be input to the global control unit 210.

The MRAM cell array 206 includes multiple rows corresponding to word lines (WL), for example a word line 118 and multiple columns corresponding to bit lines, for example a bit line 112. In one configuration the MRAM cell array 206 has 64 rows of word lines and 256 bit lines. The MRAM cell array 206 includes numerous unit cells such as a unit cell 100, coupled to the word line 118 and the bit line (BL) (or source line (SL)) 112. Each unit cell includes a memory cell 100 as described with reference to FIG. 1.

An example of a conventional repair process in a conventional MRAM architecture is described with reference to FIG. 3A. The conventional repair process includes execution of a macro test to identify failed memory cells in the memory cell array.

Figure 3A:
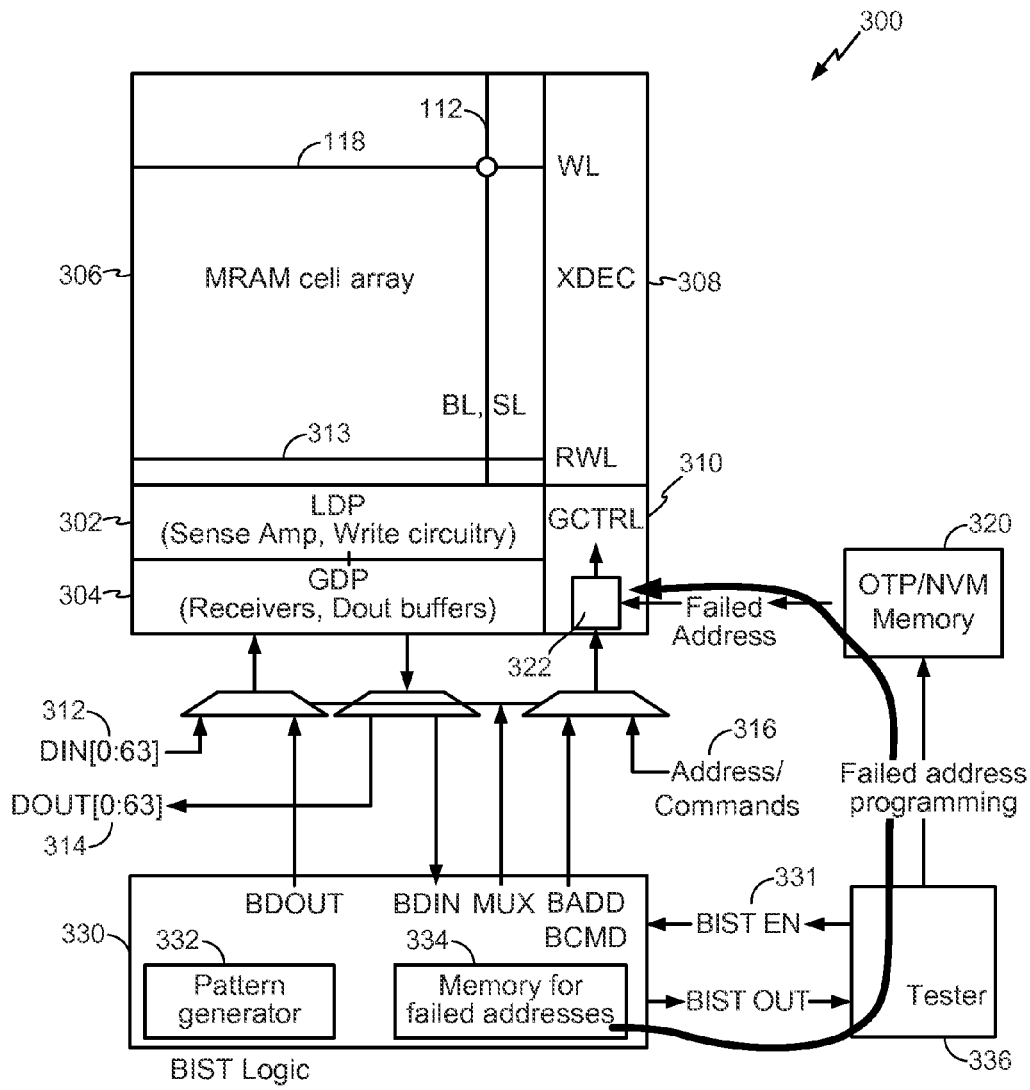
FIGS. 3A and 3B are diagrams of conventional MRAM architectures including built in self test (BIST) circuitry configured for interacting with an external tester.

In FIG. 3A, the MRAM architecture 300 may include a local data path (LDP) 302, a global data path (GDP) 304, a cell array 306, a decoder 308, and a global control unit 310. The LDP 302 includes one or more sense amplifiers and a programming write driver (not shown). The GDP 304 includes circuitry for input and output signal lines or pins, such as a data in (DIN) 312 and a data out (DOUT) 314. The global data path 304 may also include error correcting code (ECC) circuitry (not shown). Addresses or commands 316 may also be input to the global control unit 310.

The MRAM cell array 306 includes multiple rows corresponding to word lines, for example a word line 118 and multiple columns corresponding to bit lines, for example a bit line 112. In one configuration the MRAM cell array 306 has 64 rows of word lines and 256 bit lines. The MRAM cell array 306 includes numerous unit cells, coupled to the word line 118 and the bit line 112. Each unit cell includes a memory cell 100, as described with reference to FIG. 1.

The conventional MRAM architecture 300 also includes BIST circuitry 330. The BIST circuitry 330 includes a BIST pattern generator 332, and a volatile BIST memory for failed addresses 334. In the example of a repair process shown in FIG. 3A, the BIST logic process is enabled by sending a BIST enable signal 331 from an external tester 336 to the BIST circuitry 330. The macro test is executed using BIST commands, addresses and patterns. The macro test identifies the failed memory cells in the MRAM cell array 306 and writes the addresses of the failed memory cells into the volatile BIST memory for failed addresses 334.

The addresses of the failed memory cells are then transferred from the volatile BIST memory for failed addresses 334 to the external tester 336 via the BIST OUT line. The interface between the BIST memory for failed addresses 334 and the external tester 336 may be a standard tester interface, such as joint test action group (JTAG) interface, for example.

The external tester 336 then programs the addresses of the failed memory cells to the one time programmable/non-volatile memory (OTP/NVM) 320 in a system on a chip (SoC). The failed addresses are provided from the OTP/NVM 320 to address matching circuitry (AMC) 322 in the global control unit 310.

The MRAM architecture 300 is configured to avoid using failed memory cells by comparing the incoming address of each memory access to failed addresses stored in the AMC 322. When an incoming address matches a failed address stored in the AMC 322, a redundant memory cell is enabled and the memory operation is redirected to the redundant memory cell. The redundant memory cell may be located on a redundant word line 313, for example. BIST data out (BDOUT), BIST data in (BDIN), multiplexor (MUX) and BIST command and address BADD/BCMD lines are also provided.

Another example of a conventional repair process in a conventional MRAM architecture is described with reference to FIG. 3B. The conventional repair process includes execution of a macro test to identify failed memory cells in the memory cell array.

Figure 3B:
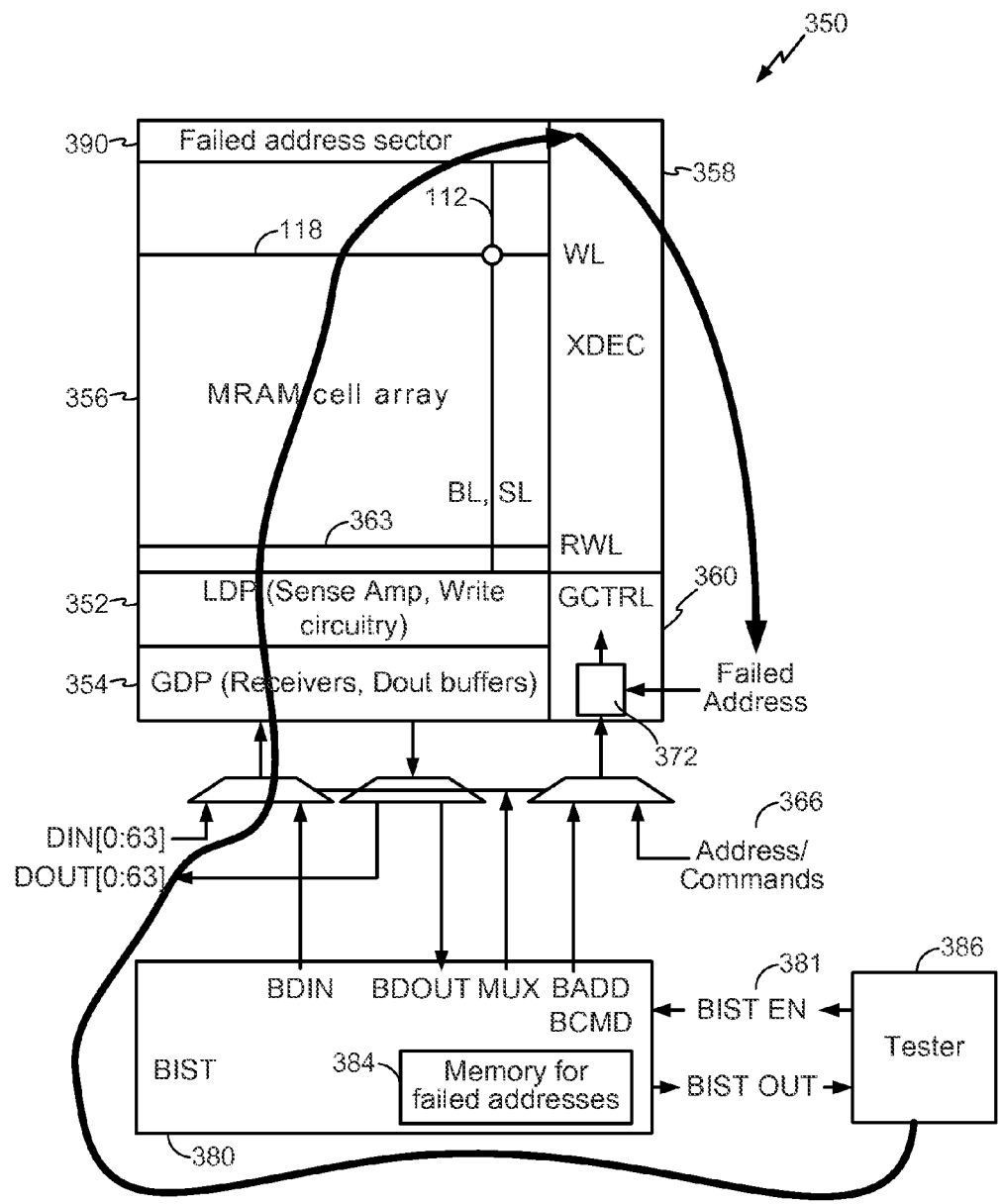

In FIG. 3B, the MRAM architecture 350 may include a local data path (LDP) 352, a global data path (GDP) 354, a cell array 356, a decoder 358, and a global control unit 360. The LDP 352 includes one or more sense amplifiers and a programming write driver (not shown). The GDP 354 includes circuitry for input and output signal lines or pins, such as a data in (DIN) and a data out (DOUT). The global data path 354 may also include error correcting code (ECC) circuitry (not shown). Addresses or commands 366 may also be input to the global control unit 360.

The MRAM cell array 356 includes multiple rows corresponding to word lines, for example a word line 118, and multiple columns corresponding to bit lines, for example a bit line 112. The MRAM cell array 356 includes numerous unit cells coupled to the word line 118 and the bit line 112. Each unit cell includes a memory cell 100, as described with reference to FIG. 1.

The conventional MRAM architecture 350 includes BIST circuitry 380. The BIST circuitry 380 includes a volatile BIST memory for failed addresses 384. In the example of a repair process shown in FIG. 3B, the BIST logic process is enabled by sending a BIST enable signal 381 from an external tester 386 to the BIST circuitry 380. The macro test is executed using BIST commands, addresses and patterns. The macro test identifies the failed memory cells in the MRAM cell array 356 and writes the addresses of the failed memory cells into the volatile BIST memory for failed addresses 384.

The addresses of the failed memory cells are then transferred from the volatile BIST memory for failed addresses 384 to the external tester 386. The interface between the BIST memory for failed addresses 384 and the external tester 386 may be a standard tester interface such as joint test action group (JTAG) interface, for example.

The external tester 386 then programs the addresses of the failed memory cells to a failed address sector 390 of the MRAM cell array 356. The failed addresses are provided from the failed address sector 390 of the MRAM cell array 356 to address matching circuitry (AMC) 372 in the global control unit 360.

The MRAM architecture 350 is configured to avoid using failed memory cells by comparing the incoming address of each memory access to failed addresses stored in the AMC 372. When an incoming address matches a failed address stored in the AMC 372, a redundant memory cell is enabled and the memory operation is redirected to the redundant memory cell. The redundant memory cell may be located on a redundant word line 363, for example.

A repair process for an MRAM architecture according to an aspect of the present disclosure is described with reference to FIG. 4A. The MRAM architecture 400 includes BIST circuitry 430. The BIST circuitry 430 includes a BIST pattern generator 432, and a volatile BIST memory for failed addresses 434.

According to an aspect of the present disclosure, the MRAM architecture 400 includes a memory cell array 406 on a chip and built-in self test (BIST) circuitry 430 on the chip coupled to the memory cell array 406. The BIST circuitry 430 is configured to perform a magnetic random access memory (MRAM) write operation to write addresses of failed memory cells in the memory cell array 406 (e.g., failed addresses) to a failed address sector 440 in the memory cell array 406. First select circuitry 442 is coupled between the BIST circuitry 430 and the memory cell array 406. The first select circuitry 442 is configured to selectively couple an output of the BIST circuitry 430 or a set of input data 412 to the memory cell array 406.

According to an aspect of the present disclosure, the first select circuitry 442 includes a first portion 424 configured to selectively couple an output (BIST data out (BDOUT)) 423 of the BIST circuitry 430 and a set of input data 412 to the memory cell array 406. The first select circuitry 442 also has a second portion 426 configured to selectively couple an output of the memory cell array 406 to a set of output data lines 414 or to the BIST circuitry 430 via second portion output (BIST data in (BDIN)) 425. A third portion 428 of the first select circuitry 442 is configured to selectively couple a global control unit 410 of the MRAM architecture 400 to a set of address and command data (BIST address data (BADD) and BIST command data (BCMD)) 429 from the BIST circuitry 430 or to a set of address and command lines 416 from a source external to the chip, such as an external tester 436. A multiplexor (MUX) select signal 427 controlling the first portion 424, the second portion 426 and the third portion 428 is generated by the BIST circuitry 430.

According to an aspect of the present disclosure, the BIST circuitry 430 includes a pattern generator 432, a memory storing failed address data 434, and BIST select circuitry 435. The BIST select circuitry 435 is configured to selectively couple an output of the pattern generator 432 or an output of the memory storing failed address data 434 to the first select circuitry 442. According to an aspect of the present disclosure, the pattern generator 432 may be configured as a state machine, for example. A select signal for controlling the BIST select circuitry 435 is generated by the BIST circuitry 430.

Global control logic circuitry 410 is coupled to the memory cell array 406. The global control logic circuitry 410 includes address matching circuitry 422 configured to receive the addresses of the failed memory cells directly from the failed address sector 440.

According to an aspect of the present disclosure, a pathway coupled between the BIST circuitry 430 and the failed address sector 440 may be configured for directly transferring the addresses of failed memory cells to the failed address sector 440 without providing the addresses to an external tester 436.

Figure 4A:
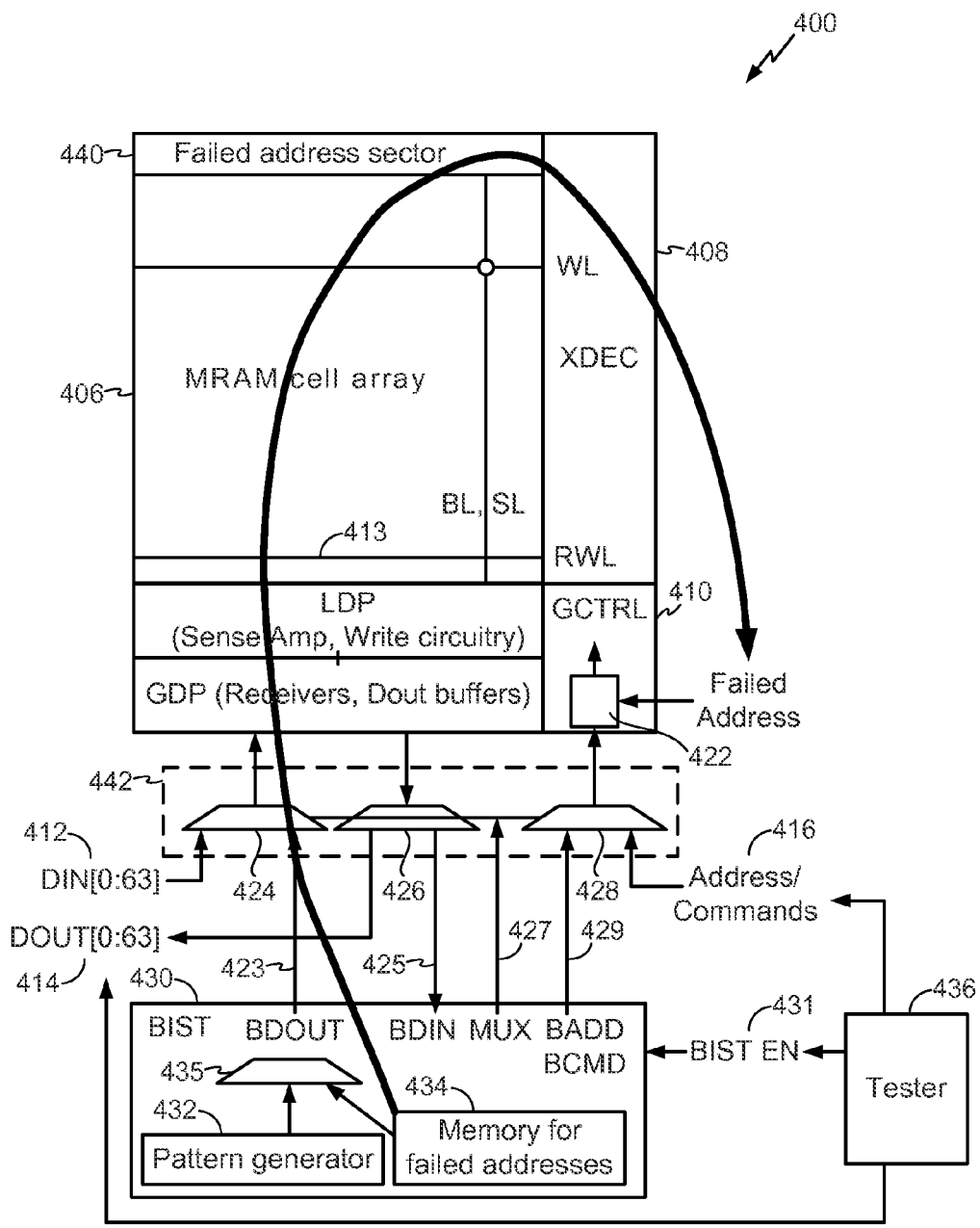
FIGS. 4A and 4B are diagrams of an MRAM architecture including BIST circuitry according to an aspect of the present disclosure.

As shown in FIG. 4A, the repair process for the MRAM architecture 400 may be initiated by sending a BIST enable signal 431 from an external tester 436 to the BIST circuitry 430.

A macro test is executed using BIST commands. BIST addresses and BIST patterns generated by the BIST circuitry 430 and pattern generator 432. The macro test identifies the failed memory cells and writes the addresses of the failed memory cells into the volatile BIST memory for failed addresses 434.

The addresses of the failed memory cells are then transferred from the volatile BIST memory for failed addresses 434 directly to the failed address sector 440 of the MRAM cell array 406. According to an aspect of the present disclosure, the transfer of the failed addresses from the volatile BIST memory for failed addresses 434 directly to the failed address sector 440 of the MRAM cell array 406 is performed by an MRAM write operation that is executed by the BIST circuitry 430. The failed addresses are provided from the failed address sector 440 of the MRAM cell array 406 to address matching circuitry (AMC) 422 in the global control unit 410.

The MRAM architecture 400 is configured to avoid using failed memory cells by comparing the incoming address of each memory access to failed addresses stored in the AMC 422. When an incoming address matches a failed address stored in the AMC 422, a redundant memory cell is enabled and the memory operation is redirected to the redundant memory cell. The redundant memory cell may be located on a redundant word line 413, for example.

A repair process for an MRAM architecture according to another aspect of the present disclosure is described with reference to FIG. 4B. In this aspect, an external tester controls the failed address transfer. The MRAM architecture 450 includes BIST circuitry 480. The BIST circuitry 480 includes a BIST pattern generator 482, and a volatile BIST memory for failed addresses 484.

According to an aspect of the present disclosure, the MRAM architecture 450 includes a memory cell array 456 on a chip and built-in self test (BIST) circuitry 480 on the chip coupled to the memory cell array 456. The BIST circuitry 480 is configured to perform a magnetic random access memory (MRAM) write operation to write addresses of failed memory cells in the memory cell array 456 (e.g., failed address memory cells 468) to a failed address sector 490 in the memory cell array 456. First select circuitry 492 is coupled between the BIST circuitry 480 and the memory cell array 456. The first select circuitry 492 is configured to selectively couple an output of the BIST circuitry 480 or a set of input data 462 to the memory cell array 456.

According to an aspect of the present disclosure, the first select circuitry 492 includes a first portion 474 configured to selectively couple an output 473 of BIST select circuitry 488 and a set of input data (DIN) 462 to the memory cell array 456. The BIST select circuitry 488 is input signals 489, 487 from the BIST circuitry 480 and output data 464, which may also be used as the select signal for the BIST select circuitry 488.

A second portion 476 of the select circuitry 492 is configured to selectively couple an output of the memory cell array 456 to a set of output data lines 464 or to the BIST circuitry 480 via second portion output (BDIN) 475. A third portion 478 of the first select circuitry 492 is configured to selectively couple a global control unit 460 of the MRAM architecture 450 to a set of address and command data (BADD, BCMD) 479 from the BIST circuitry 480 or to a set of address and command data lines 466 from a source external to the chip, such as an external tester 486. A multiplexor (MUX) select signal 477 controlling the first portion 474, the second portion 476 and the third portion 478 is generated by the BIST circuitry 480.

According to an aspect of the present disclosure, the BIST circuitry 480 includes a pattern generator 482, a memory storing failed address data 484, and BIST select circuitry 488, which may be located outside the BIST circuitry 480. The BIST select circuitry 488 is configured to selectively couple an output 489 of the pattern generator 482 or an output 487 of the memory storing failed address data 484 to the first select circuitry 492 via the output 473. According to an aspect of the present disclosure, the pattern generator 482 may be configured as a state machine, for example. A select signal for controlling the BIST select circuitry 488 is generated by the BIST circuitry 480 or may also be the output data 464.

Global control logic circuitry 460 is coupled to the memory cell array 456. The global control logic circuitry 460 includes address matching circuitry 472 configured to receive the addresses of the failed memory cells directly from the failed address sector 490. According to an aspect of the present disclosure, a pathway coupled between the BIST circuitry 480 and the failed address sector 490 may be configured for directly transferring the addresses of failed memory cells to the failed address sector 490 without providing the addresses to an external tester 486.

Figure 4B:
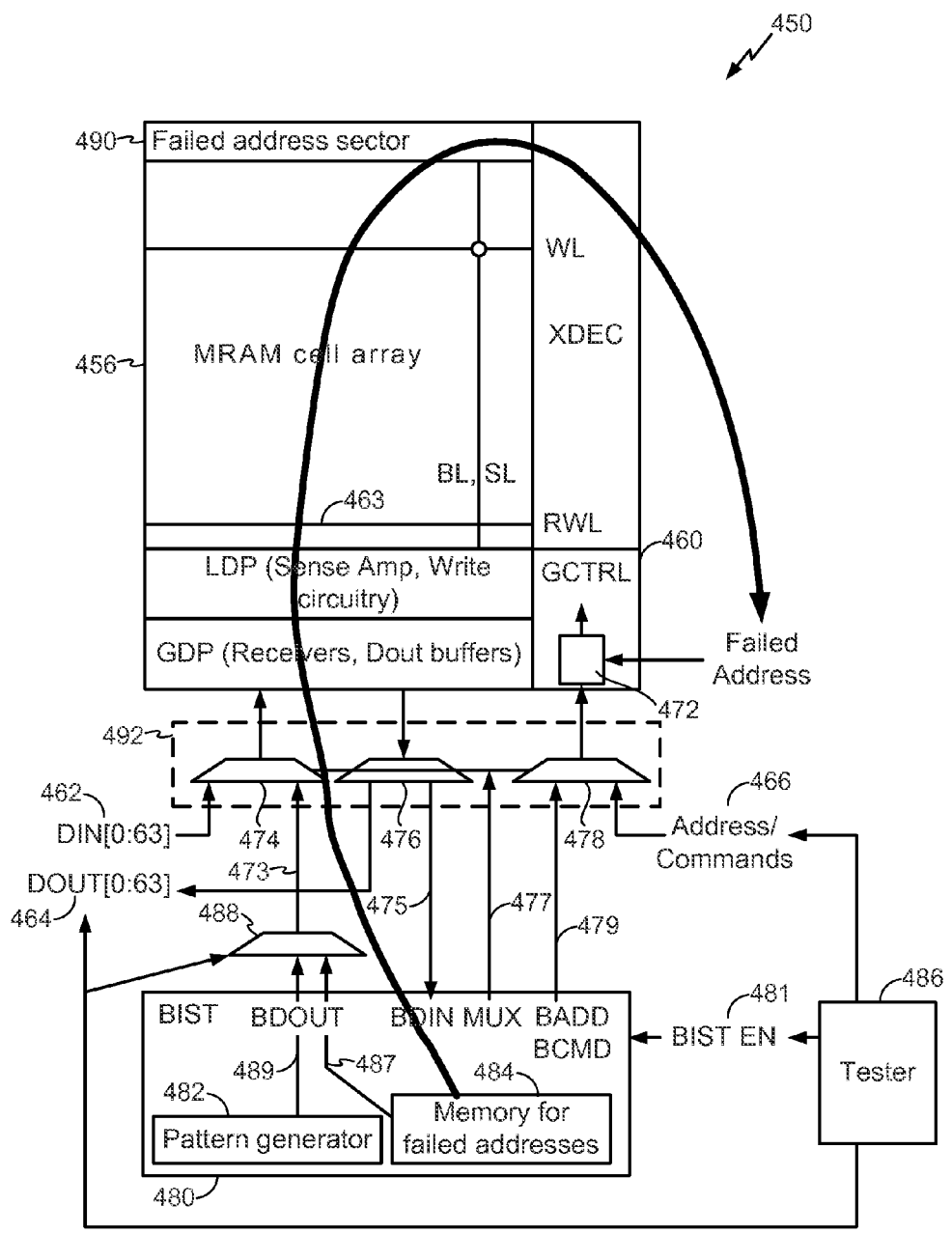

As shown in FIG. 4B, the repair process of the MRAM architecture 450 may be initiated by sending a BIST enable signal 481 from an external tester 486 to the BIST circuitry 480. A macro test is executed using BIST commands, BIST addresses and BIST patterns generated by the BIST circuitry 480 and the pattern generator 482. The macro test identifies the failed memory cells and writes the addresses of the failed memory cells into the volatile BIST memory for failed addresses 484.

The addresses of the failed memory cells are then transferred from the volatile BIST memory for failed addresses 484 directly to the failed address sector 490 of the MRAM cell array 456. According to an aspect of the present disclosure, the transfer of the failed addresses from the volatile BIST memory for failed addresses 484 directly to the failed address sector 490 of the MRAM cell array 456 is performed by an MRAM write operation that is controlled by the external tester 486.

The failed addresses 4 are provided from the failed address sector 490 of the MRAM cell array 456 to address matching circuitry (AMC) 472 in the global control unit 460. The MRAM architecture 450 is configured to avoid using failed memory cells by comparing the incoming address of each memory access to failed addresses stored in the AMC 472. When an incoming address matches a failed address stored in the AMC 472, a redundant memory cell is enabled and the memory operation is redirected to the redundant memory cell. The redundant memory cell may be located on a redundant word line 463, for example.

Figure 5A:
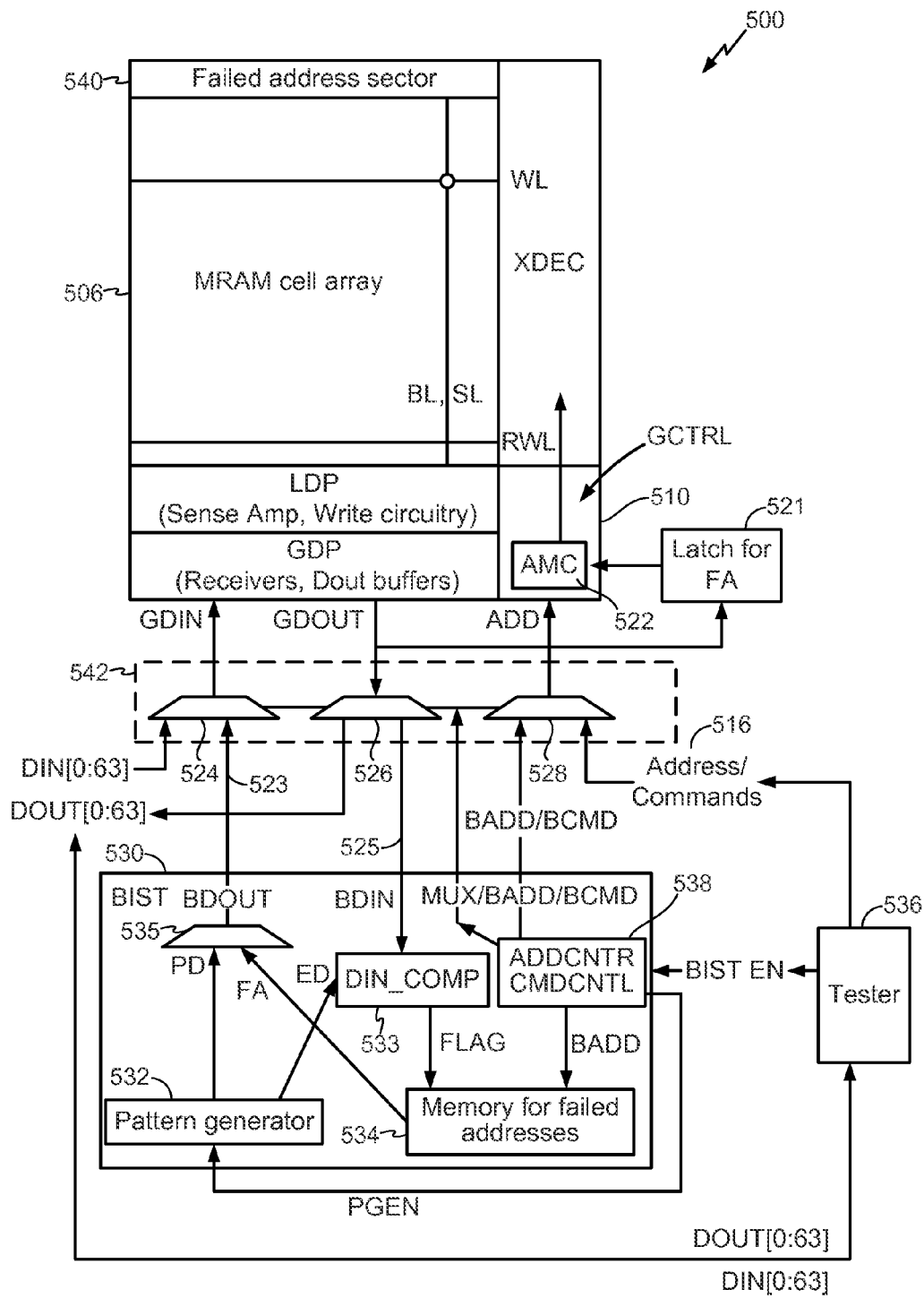
FIG. 5A is a diagram of an MRAM architecture including BIST circuitry according to an aspect of the present disclosure.
Figure 5B:
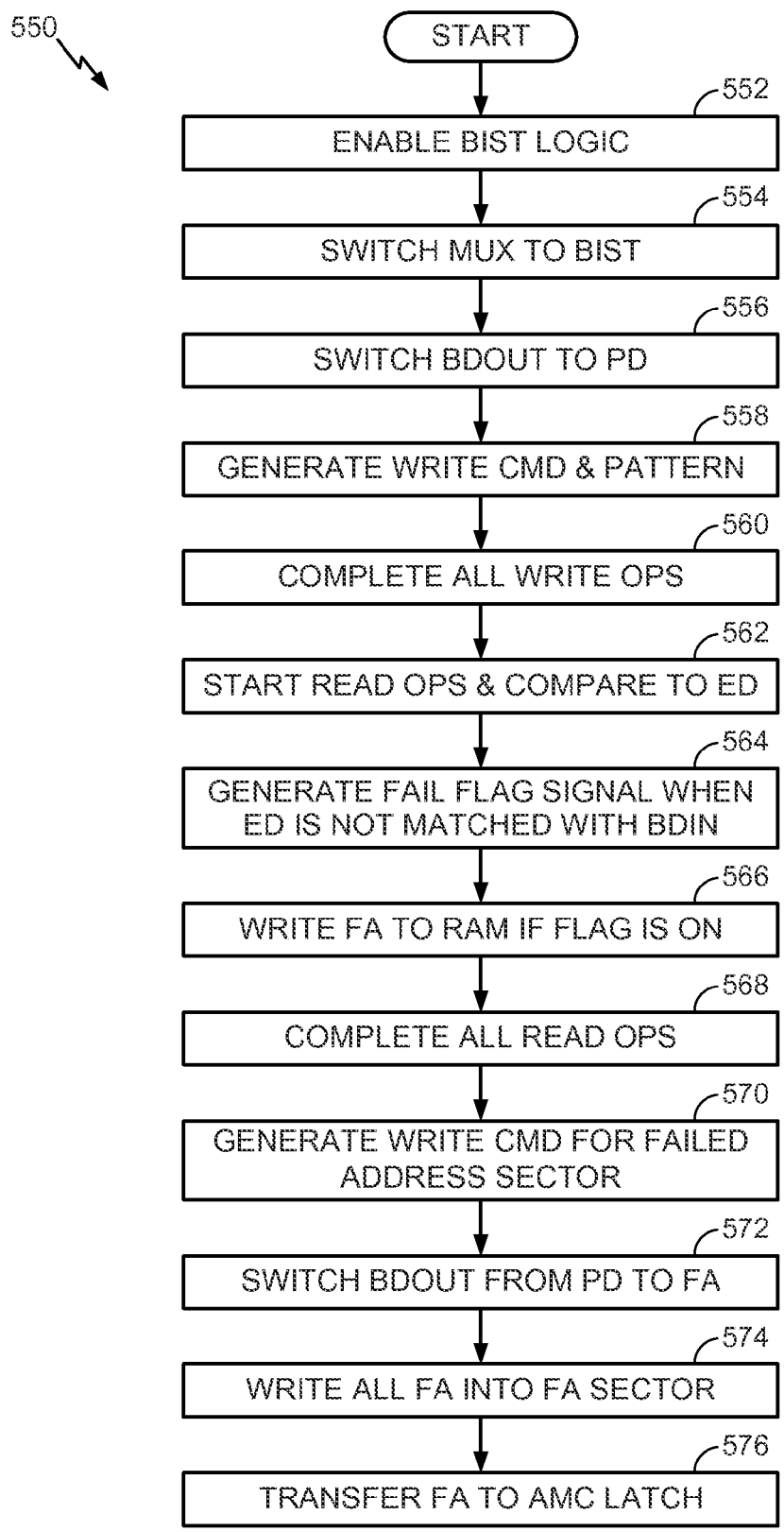
FIG. 5B is a process flow diagram illustrating an MRAM test method using BIST circuitry according to aspects of the present disclosure.

A method for performing an MRAM macro test to find failed memory cells in an MRAM array according to an aspect of the present disclosure is described with reference to an MRAM array architecture 500 shown in FIG. 5A and the macro test process 550 shown in FIG. 5B. In block 552, the macro test process 550 is initiated by a BIST enable signal BIST EN applied to BIST circuitry 530. The BIST enable signal BIST EN may be sent to a BIST controller 538 of the BIST circuitry 530 from an external tester 536.

In block 554 of the macro test process 550, the BIST controller 538 sends a mux select signal MUX to first select circuitry 542. In response to the mux select signal MUX, the first select circuitry 542 switches from a normal configuration to a BIST configuration. In the BIST configuration, the first portion 524 of the first select circuitry 542 is configured to couple BIST data output 523 from the BIST circuitry 530 to the memory cell array 506 and to decouple a normal data input path DIN from the memory cell array 506. In the BIST configuration, the second portion 526 of the first select circuitry 542 is configured to couple output from the memory cell array 506 to the BIST circuitry 530 and to decouple the memory cell array 506 from a normal data output path DOUT. In the BIST configuration, the third portion 528 of the first select circuitry 542 is configured to couple a BIST address/command path BADD/BCMD from the BIST controller 538 to the global controller 510 of the MRAM array architecture 500 and to decouple a normal address/command path 516 from the global controller 510.

In block 556 of the macro test process 550, BIST select circuitry 535 is switched to couple pattern data output PD from the pattern generator 532 to the BIST select circuitry 535, which also takes as input failed addresses FA. The BIST select circuitry 535 then coupled either the pattern data output PD or the failed addresses FA to the first portion 524 of the first select circuitry 542. The first portion 524 of the first select circuitry 542 eventually couples or writes the pattern data output PD to the memory cell array 506.

In block 558 of the macro test process 550, the BIST controller 538 generates BIST address/commands BADD/BCMD and sends a pattern generate command PGEN to the pattern generator 532. In response to the pattern address/commands BADD/BCMD and the pattern generate command PGEN, test pattern input data is written to the memory cell array 506. In block 560 of the macro test process, the writing of test pattern input data to the memory cell array 506 is completed.

In block 562 of the macro test process 550, test pattern output data BDIN is read from the memory cell array 506 to comparison circuitry 533 of the BIST circuitry 530. The comparison circuitry 533 compares the test pattern output data BDIN with expected data ED from the pattern generator 532. The expected data ED matches the pattern data output PD that was written to the memory cell array 506.

In block 564 of the macro test process 550, the comparison circuitry 533 generates a fail flag signal FLAG if the test pattern output data 525 does not match the expected data ED. In block 566 of the macro test process 550, in response to the fail flag signal FLAG, the failed addresses are written to the BIST memory for failed addresses 534 in the BIST circuitry 530. In one implementation, the RAM in block 566 can also be a volatile memory for the BIST circuitry 530 to store failed addresses. In block 568 of the macro test process 550, reading of the memory cell array 506 is completed.

In block 570 of the macro test process 550, the BIST circuitry generates a write command for the failed address sector 540 of the memory cell array 506. In block 572 of the macro test process 550, BIST select circuitry 535 is switched to couple failed addresses FA from the BIST memory for failed addresses 534 to the MRAM circuitry 506 via the first portion 524 of the first select circuitry 542. In block 572 of the macro test process 550, the failed addresses are written from the BIST memory for failed addresses 534 to the failed address sector 540 of the memory cell array 506.

In block 576 of the macro test process 550, the failed addresses are transferred from the failed address sector 540 of the memory cell 506 to latch circuitry 521 of the address matching circuitry 522 using a normal read data path (GD-OUT).

Figure 6A:
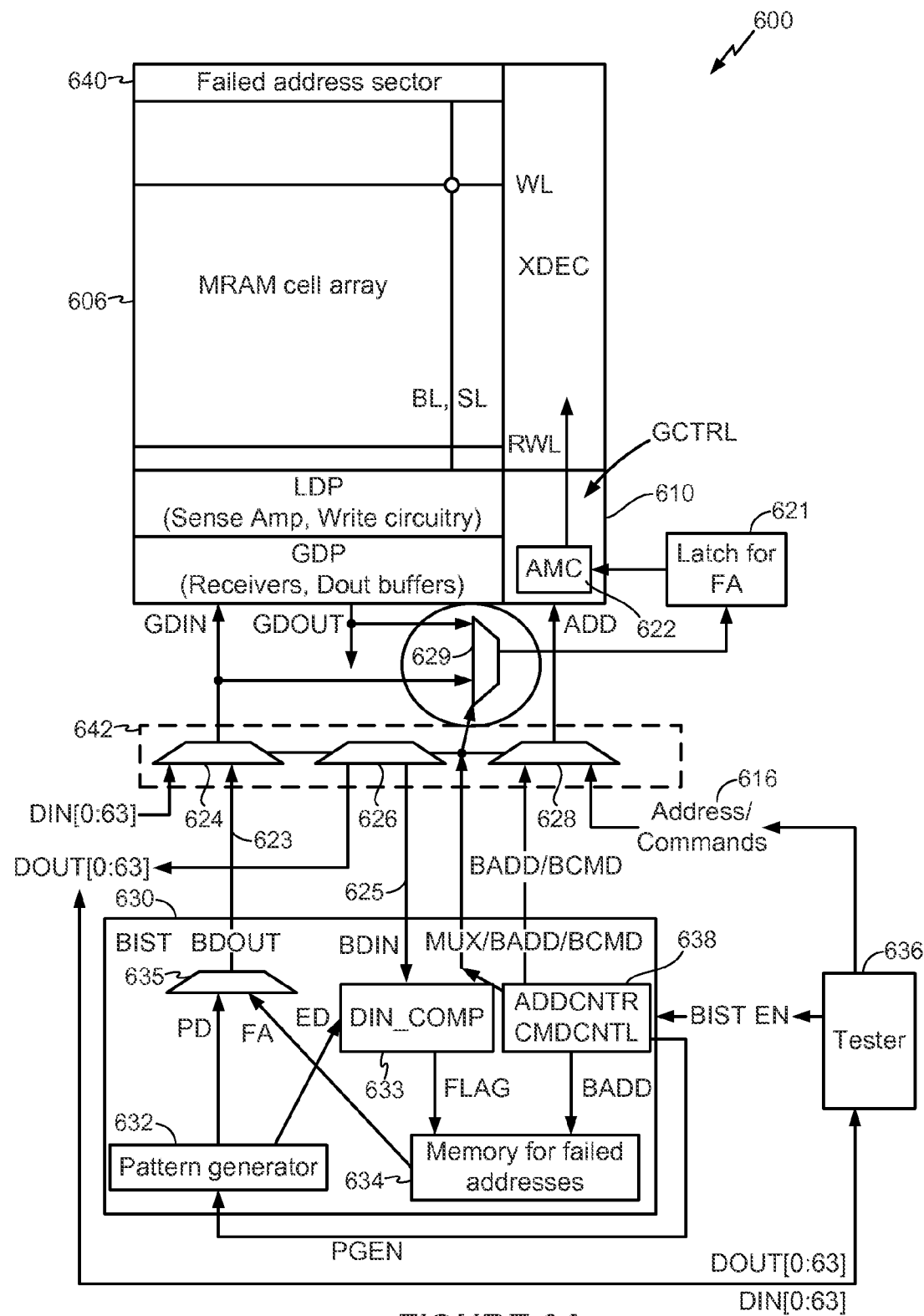
FIG. 6A is a diagram of an MRAM architecture including BIST circuitry according to an aspect of the present disclosure.
Figure 6B:
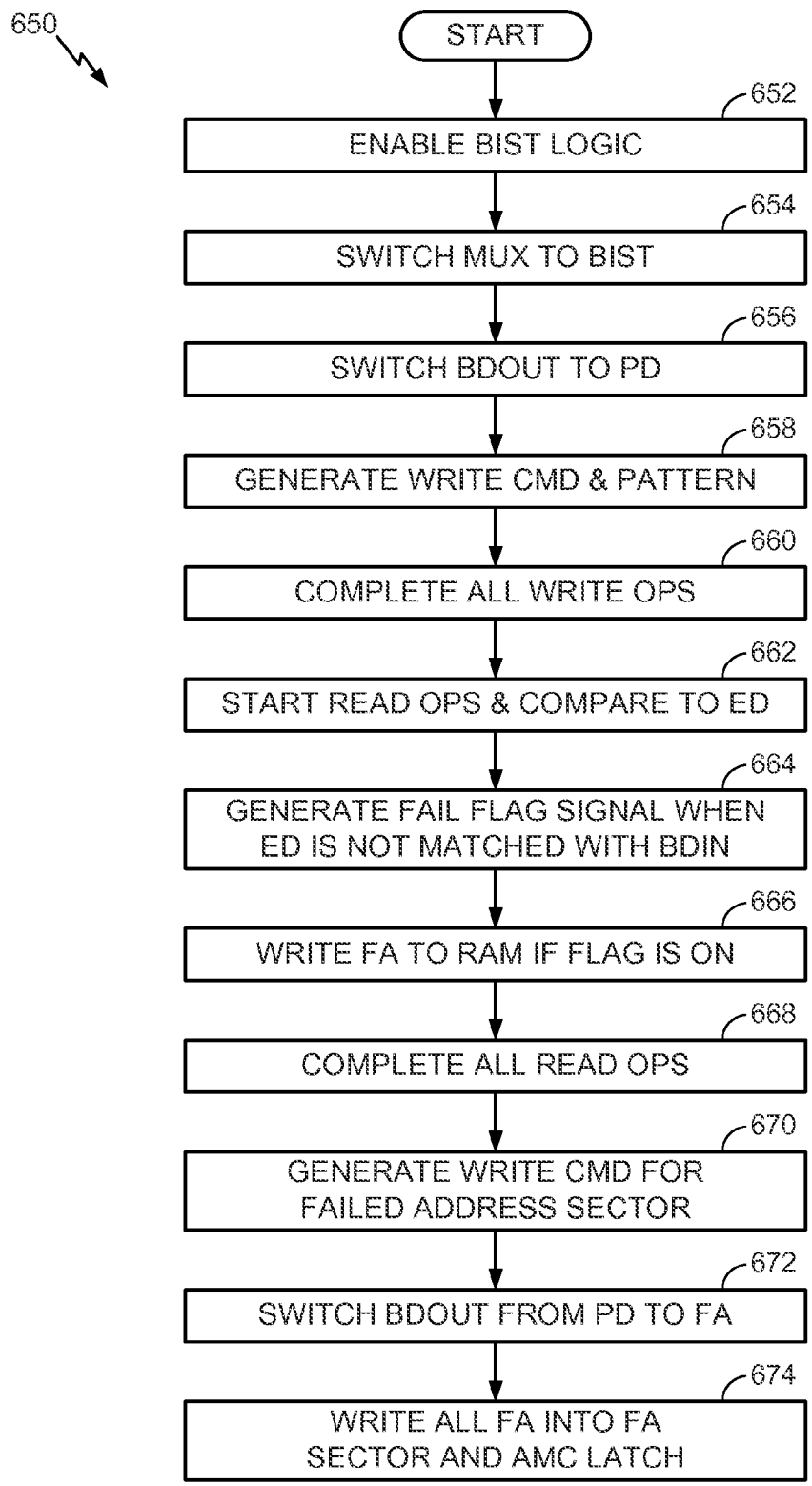
FIG. 6B is a process flow diagram illustrating an MRAM test method using BIST circuitry according to aspects of the present disclosure.

In another aspect of the present disclosure, failed addresses are written from a volatile BIST memory for failed addresses to a failed address sector of a memory cell array and to volatile memory in address matching circuitry. A method for performing an MRAM macro test to find failed memory cells in an MRAM array according to this aspect of the present disclosure is described with reference to an MRAM array architecture 600 shown in FIG. 6A and the macro test process 650 shown in FIG. 6B. In block 652, the macro test process 650 is initiated by a BIST enable signal BIST EN applied to BIST circuitry 630. The BIST enable signal BIST EN may be sent to a BIST controller 638 of the BIST circuitry 630 from an external tester 636.

In block 654 of the macro test process 650, the BIST controller 638 sends a mux select signal MUX to first select circuitry 642. In response to the mux select signal MUX, the first select circuitry 642 switches from a normal configuration to a BIST configuration. In the BIST configuration, the first portion 624 of the first select circuitry 642 is configured to couple BIST data output 623 from the BIST circuitry 630 to the memory cell array 606 and to decouple a normal data input path DIN from the memory cell array 606. In the BIST configuration, the second portion 626 of the first select circuitry 642 is configured to couple output from the memory cell array 606 to the BIST circuitry 630 and to decouple the memory cell array 606 from a normal data output path DOUT. In the BIST configuration, the third portion 628 of the first select circuitry 642 is configured to couple a BIST address/command path BADD/BCMD from the BIST controller 638 to the global controller 610 of the MRAM array architecture 600 and to decouple a normal address/command path 616 from the global controller 610.

In block 656 of the macro test process 650, BIST select circuitry 635 is switched to couple pattern data output PD from the pattern generator 632 to the BIST select circuitry 635, which also takes as input failed addresses FA. The BIST select circuitry 635 then coupled either the pattern data output PD or the failed addresses FA to the first portion 624 of the first select circuitry 642. The first portion 624 of the first select circuitry 642 eventually couples or writes the pattern data output PD to the memory cell array 606.

In block 658 of the macro test process 650, the BIST controller 638 generates BIST address/commands BADD/BCMD and sends a pattern generate command PGEN to the pattern generator 632. In response to the pattern address/commands BADD/BCMD and the pattern generate command PGEN, test pattern input data is written to the memory cell array 606. In block 660 of the macro test process, the writing of test pattern input data to the memory cell array 606 is completed.

In block 662 of the macro test process 650, test pattern output data BDIN is read from the memory cell array 606 to comparison circuitry 633 of the BIST circuitry 630. The comparison circuitry 633 compares the test pattern output data BDIN with expected data ED from the pattern generator 632. The expected data ED matches the pattern data output PD that was written to the memory cell array 606.

In block 664 of the macro test process 650, the comparison circuitry 633 generates a fail flag signal FLAG if the test pattern output data 625 does not match the expected data ED. In block 666 of the macro test process 650, in response to the fail flag signal FLAG, the failed addresses are written to the BIST memory for failed addresses 634 in the BIST circuitry 630. In one implementation, the RAM in block 666 can also be a volatile memory for the BIST circuitry 630 to store failed addresses. In block 668 of the macro test process 650, reading of the memory cell array 606 is completed.

In block 670 of the macro test process 650, the BIST circuitry generates a write command for the failed address sector 640 of the memory cell array 606. In block 672 of the macro test process 650, BIST select circuitry 635 is switched to couple failed addresses FA from the BIST memory for failed addresses 634 to the MRAM circuitry 606 via the first portion 624 of the first select circuitry 642. According to this aspect of the present disclosure, multiplexer circuitry 629 is configured to selectively couple an output or an input of the memory cell array 606 to latch circuitry 621. In block 674 of the macro test process 650, the failed addresses are written from the BIST memory for failed addresses 634 to the failed address sector 640 of the memory cell array 606. At the same time, the multiplexer circuitry 629 is switched to couple the input path GDIN of the memory cell array 606 to the latch circuitry 621 so that the failed addresses are also written directly to the latch circuitry 621, which is coupled to the address matching circuit 622.

An aspect of the present disclosure includes an apparatus for memory self repair. According to this aspect, the apparatus includes means for performing a built-in self test (BIST) process on a chip to identify addresses of failed memory cells in a memory cell array on the chip. The apparatus also includes means for transferring the addresses of the failed memory cells directly from the BIST circuitry to a portion of the memory cell array. The means used for performing the BIST process to identify addresses of failed memory cells may include BIST circuitry 430, BIST circuitry 480, BIST circuitry 530 and BIST circuitry 630. The means used for transferring the addresses of the failed memory cells from the BIST circuitry to a portion of the memory cell array may include the first select circuitry 442, first select circuitry 492, first select circuitry 542, first select circuitry 642, MUX select circuitry 629, global control unit 410 and address matching circuit 422, global control unit 460 and address matching circuit 472, global control unit 510 and address matching circuit 522, global control unit 610 and address matching circuit 622, as well as latch circuitry 521 and latch circuitry 621. The relevant means may also include integrated circuits, memory modules or computer hardware implemented with instructions or software. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
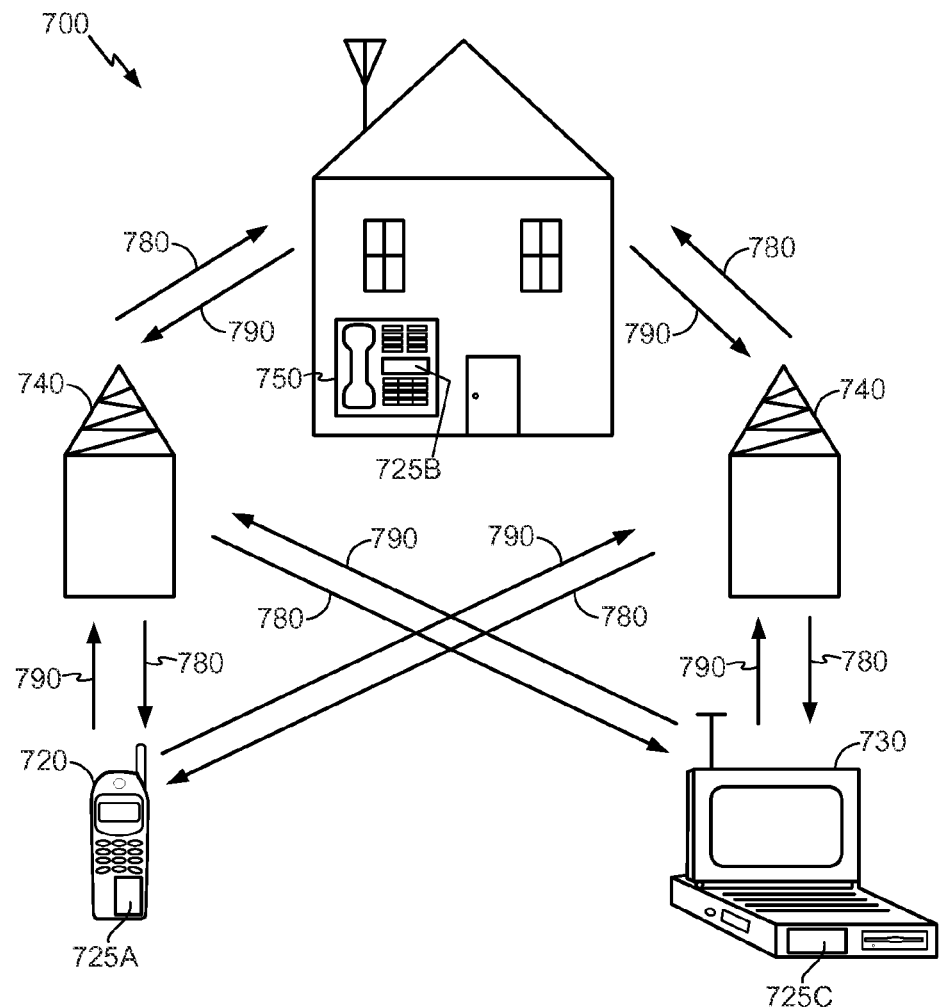
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B that include the disclosed memory cell array. It will be recognized that other devices may also include the disclosed memory cell arrays, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many devices which include the disclosed memory cell arrays.

Figure 8:
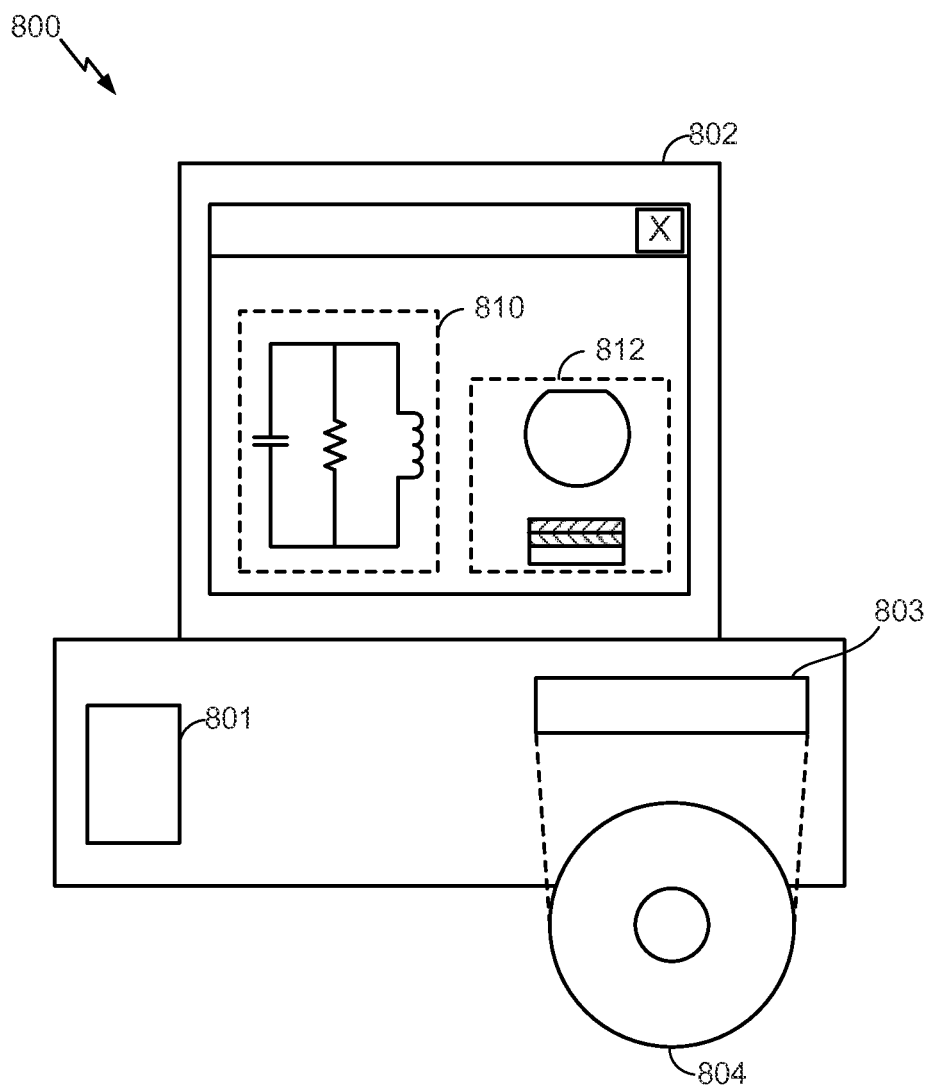
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the memory cell array disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a memory cell array. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A memory comprising:
a memory cell array on a chip;
a built-in self test (BIST) circuit on the chip and coupled to the memory cell array, the BIST circuit configured to perform a write operation to write addresses of failed memory cells in the memory cell array to a failed address sector in the memory cell array;
a first select circuit coupled between the BIST circuit and the memory cell array, the first select circuit configured to selectively couple an output of the BIST circuit and an input to the memory cell array; and
a pathway coupled between the BIST circuit and the failed address sector, the pathway configured for directly transferring addresses of failed memory cells to the failed address sector without providing addresses to an external tester.

2. The memory of claim 1, in which the first select circuit comprises:
a first portion configured to selectively couple an output of the BIST circuit and a set of input data to the memory cell array;
a second portion configured to selectively couple an output of the memory cell array to a set of output data and the BIST circuit; and
a third portion configured to selectively couple a set of address and command data from the BIST circuit which a select signal used by the first portion, the second portion and the third portion is and a set of address and command data from a source external to the chip, in generated by the BIST circuit.

3. The memory of claim 1, in which the BIST circuit comprises:
a pattern generator;
a memory storing failed address data; and
a BIST select circuit configured to selectively couple an output of the pattern generator and an output of the memory storing failed address data to the first select circuit, in which a select signal used by the BIST select circuit is generated by the BIST circuit.

4. The memory of claim 3, in which a select signal used by the BIST select circuit is generated by the BIST circuit and data from a set of input data.

5. The memory of claim 4, in which the BIST select circuit is further configured to selectively couple the set of input data along with the output of the pattern generator and the output of the memory storing failed address data to the first select circuit.

6. The memory of claim 1, further comprising:
global control logic coupled to the memory cell array, the global control logic including an address matching circuit configured to receive addresses of the failed memory cells directly from the failed address sector.

7. The memory of claim 6, in which the first select circuit comprises:
a sub select circuit configured to selectively couple a set of address and command data from the BIST circuit and a set of address and command data from a source external to the chip to the address matching circuit, in which a select signal used by the sub select circuit is generated by the BIST circuit.

8. The memory of claim 6, in which the address matching circuit comprises a volatile memory to store failed addresses.

9. The memory of claim 8, in which the BIST circuit is configured to transfer failed addresses from the failed address sector to the volatile memory of the address matching circuit.

10. The memory of claim 9, in which the BIST circuit is configured to transfer failed addresses from the failed address sector to the volatile memory of the address matching circuit through a normal read data path of the memory cell array.

11. The memory of claim 1, in which the BIST circuit is configured to write failed addresses from a volatile memory of the BIST circuit to the failed address sector.

12. The memory of claim 11, in which the BIST circuit is configured to write failed addresses from the volatile memory of the BIST circuit to the failed address sector through a normal write data path of the memory cell array.

13. The memory of claim 1, in which the memory cell array comprises magnetic random access memory (MRAM) cells.

14. The memory of claim 1, integrated into a mobile phone, a set top box, a music player, a video player, an entertainment unit, a navigation device, a computer, a hand-held personal communication systems (PCS) unit, a portable data unit, and/or a fixed location data unit.

15. A method for memory self repair, comprising:
performing a built-in self test (BIST) process by BIST circuitry on a chip to identify addresses of failed memory cells in a memory cell array on the chip; and
transferring the addresses of the failed memory cells directly from the BIST circuitry to a portion of the memory cell array via a pathway coupled between the BIST circuitry and the portion of the memory cell array without providing the addresses to an external tester.

16. The method for memory self repair of claim 15, in which performing the BIST process comprises:
sending an enable signal to the BIST circuitry to turn the BIST circuitry on; and
determining an output of BIST select circuitry within the BIST circuitry based on a plurality of inputs including an output from a pattern generator and an output from a memory for addresses of failed memory cells, in which the BIST select circuitry uses a select signal generated by the BIST circuitry.

17. The method for memory self repair of claim 15, in which transferring the addresses comprises:
determining an output of first select circuitry based on a plurality of inputs including an output from the BIST select circuitry and data from a set of input data;
providing the output of the first select circuitry to the memory cell array;
determining the output of second select circuitry based on a plurality of inputs including an output of address and command data from the BIST select circuitry and address and command data from a source external to the chip; and
providing the output of the second select circuitry to an address matching circuit of global control logic on the chip.

18. The method of claim 17, in which the address matching circuit comprises a volatile memory to store failed addresses.

19. The method of claim 18, further comprising:
transferring failed addresses from the portion of the memory cell array to the volatile memory of the address matching circuit.

20. The method of claim 19, in which transferring failed addresses comprises transferring through a normal read data path of the memory cell array.

21. The method of claim 15, further comprising:
writing failed addresses from a volatile memory of the BIST circuitry to the portion of the memory cell array.

22. The method of claim 21, in which writing failed addresses comprises writing through a normal write data path of the memory cell array.

23. The method of claim 15, further comprising integrating the chip into a mobile phone, a set top box, a music player, a video player, an entertainment unit, a navigation device, a computer, a hand-held personal communication systems (PCS) unit, a portable data unit, and/or a fixed location data unit.

24. An apparatus for memory self repair comprising:
means for performing a built-in self test (BIST) process to identify addresses of failed memory cells in a memory cell array on a chip; and
means for transferring the addresses of the failed memory cells directly from BIST circuitry on the chip to a portion of the memory cell array via a pathway coupled between the BIST circuitry and the portion of the memory cell array, without providing the addresses to an external tester.

25. The apparatus of claim 24, in which the chip is integrated into a mobile phone, a set top box, a music player, a video player, an entertainment unit, a navigation device, a computer, a hand-held personal communication systems (PCS) unit, a portable data unit, and/or a fixed location data unit.

26. A method for memory self repair, comprising steps for:
performing a built-in self test (BIST) process by BIST circuitry on a chip to identify addresses of failed memory cells in a memory cell array on the chip; and
transferring the addresses of the failed memory cells directly from the BIST circuitry to a portion of the memory cell array via a pathway coupled between the BIST circuitry and the portion of the memory cell array, without providing the addresses to an external tester.

27. The method of claim 26, further comprising steps for integrating the chip into a mobile phone, a set top box, a music player, a video player, an entertainment unit, a navigation device, a computer, a hand-held personal communication systems (PCS) unit, a portable data unit, and/or a fixed location data unit.

* * * * *